(12) United States Patent
Tornila Oliver

(10) Patent No.: US 11,079,414 B2
(45) Date of Patent: Aug. 3, 2021

(54) CURRENT SENSE CIRCUIT AND METHOD THEREOF

(71) Applicant: NXP B.V., Eindhoven (NL)

(72) Inventor: Jaume Tornila Oliver, Eindhoven (NL)

(73) Assignee: NXP B.V., Eindhoven (NL)

( * ) Notice: Subject to any disclaimer, the term of this patent is extended or adjusted under 35 U.S.C. 154(b) by 192 days.

(21) Appl. No.: 16/522,785

(22) Filed: Jul. 26, 2019

(65) Prior Publication Data

US 2021/0025923 A1 Jan. 28, 2021

(51) Int. Cl.
*G01R 19/00* (2006.01)
*G01R 31/00* (2006.01)

(52) U.S. Cl.
CPC ....... *G01R 19/0092* (2013.01); *G01R 31/001* (2013.01)

(58) Field of Classification Search
CPC .......................... G01R 19/0092; G01R 31/001
See application file for complete search history.

(56) References Cited

U.S. PATENT DOCUMENTS

| | | | | |
|---|---|---|---|---|
| 5,262,713 A * | 11/1993 | Agiman | ................. | G05F 3/265 323/312 |
| 5,414,583 A * | 5/1995 | Jordan | ................. | H04L 25/0298 361/91.5 |
| 7,960,997 B2 * | 6/2011 | Williams | ........... | G01R 19/0092 324/762.09 |
| 10,228,713 B1 | 3/2019 | Hanschke et al. | | |
| 2004/0245978 A1 * | 12/2004 | Drusenthal | ............... | G05F 1/46 323/315 |
| 2007/0236848 A1 * | 10/2007 | Mayell | .................. | H02H 9/001 361/93.1 |
| 2010/0213917 A1 * | 8/2010 | Pulijala | .................. | G05F 1/575 323/293 |
| 2014/0320031 A1 * | 10/2014 | Wu | ....................... | H05B 45/397 315/193 |
| 2016/0147247 A1 | 5/2016 | Roham et al. | | |
| 2016/0233666 A1 | 8/2016 | Witcher et al. | | |
| 2016/0320433 A1 * | 11/2016 | Cheng | ................ | G01R 19/0092 |
| 2019/0305547 A1 * | 10/2019 | Tran | ......................... | H02H 9/00 |

OTHER PUBLICATIONS

Janschitz, J., "An EMI Robust LIN Driver with Low Electromagnetic Emission", Proc. of the 10th International Workshop on the Electromagnetic Compatibility of Integrated Circuits (EMC Compo), Nov. 10-13, 2015.
Schroter, P., "EMC Compliant LIN Transceiver", IEEE 2013.

* cited by examiner

*Primary Examiner* — Dominic E Hawkins

(57) ABSTRACT

A current sense circuit is provided. The current sense circuit includes an input terminal coupled to sense an input current. A first terminal of a diode is coupled as the input terminal. A current limiter has a first terminal coupled to a second terminal of the diode. A current source is coupled to a second terminal of the current limiter and configured to generate a first current. A current mirror includes a first leg coupled to the current limiter and the current source and a second leg coupled for providing an output current.

20 Claims, 4 Drawing Sheets

CURRENT SENSE CIRCUIT AND METHOD THEREOF

BACKGROUND

Field

This disclosure relates generally to electronic circuits, and more specifically, to a current sense circuit.

Related Art

Today, many electronic products can be impacted by disturbances such as electro-magnetic interference. These electro-magnetic interference disturbances may cause sensitive circuitry, such as current sensing circuits, to operate abnormally. In turn, other circuitry relying on the outputs from these current sensing circuits may fail due to the abnormal operation. In safety critical situations, such abnormal operations may cause more dire consequences. Therefore, a need exists for current sensing circuits having a more robust tolerance to electro-magnetic interference disturbances.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a current sense circuit configured and arranged to bound a sensed current with predetermined minimum and maximum currents, and thus improving robustness. By bounding the sensed current, subsequent stages are prevented from becoming unbiased due to lack of current. Having a bounded sensed current allows for a known output current during disturbance conditions such as electro-magnetic interference (EMI). Because the current sensing is based on current mirrors ratios, the current sense circuit is process, voltage, and temperature independent.

Figure 1:
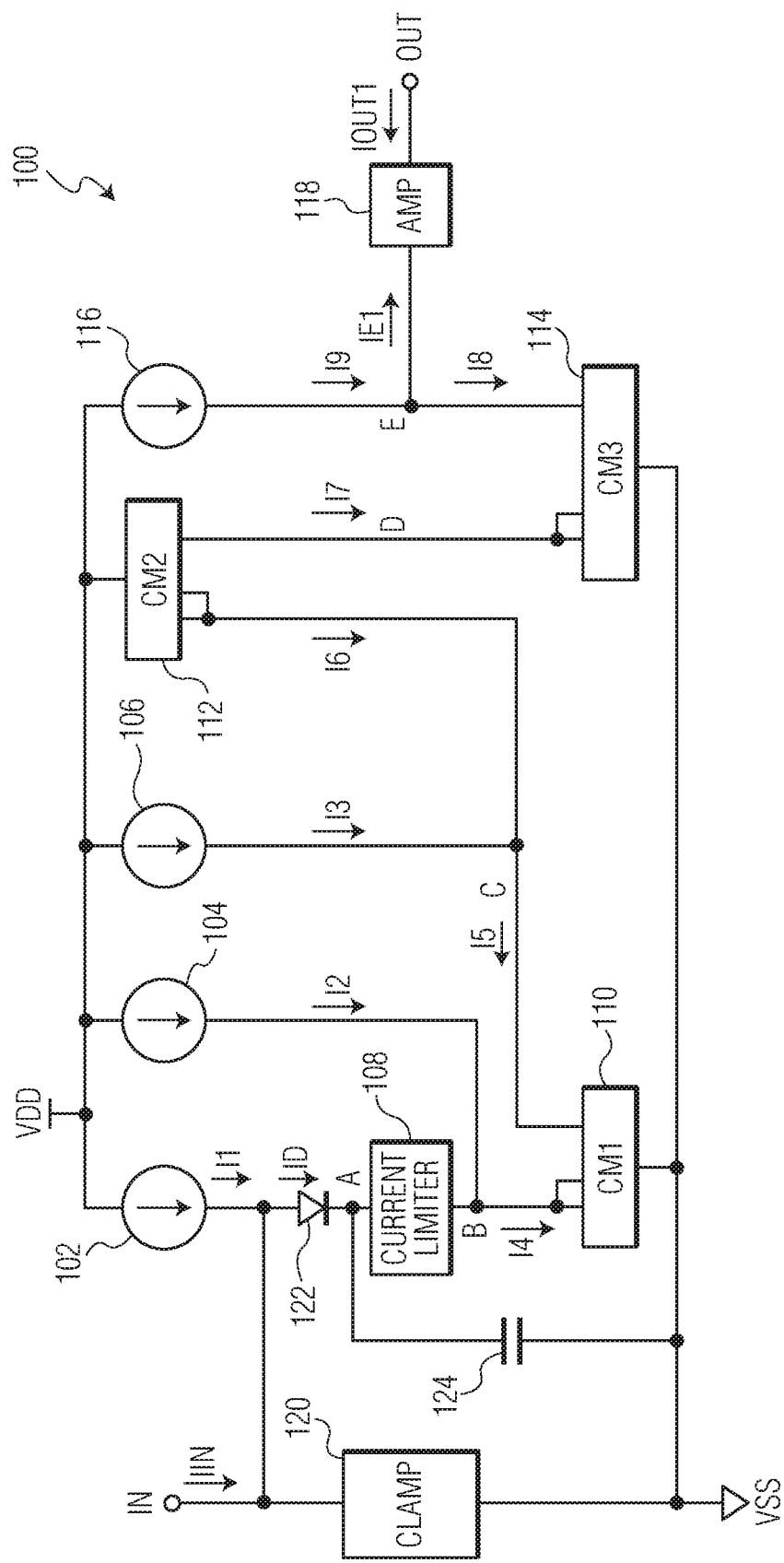
FIG. 1 illustrates, in simplified schematic diagram form, an example current sense circuit in accordance with an embodiment.

FIG. 1 illustrates, in simplified schematic diagram form, an example current sense circuit 100 in accordance with an embodiment. Current sense circuit 100 is formed as an integrated circuit and includes a current limiter circuit block 108, a current rectifier circuit 122 and 124, a clamp circuit block 120, an amplifier circuit block 118, current sources 102-106 and 116, and current mirrors 110-114. An input terminal labeled IN is coupled to sense an input current IIN and an output terminal labeled OUT is coupled for generating and providing an amplified current IOUT1 based on the sensed current IIN.

Figure 3:
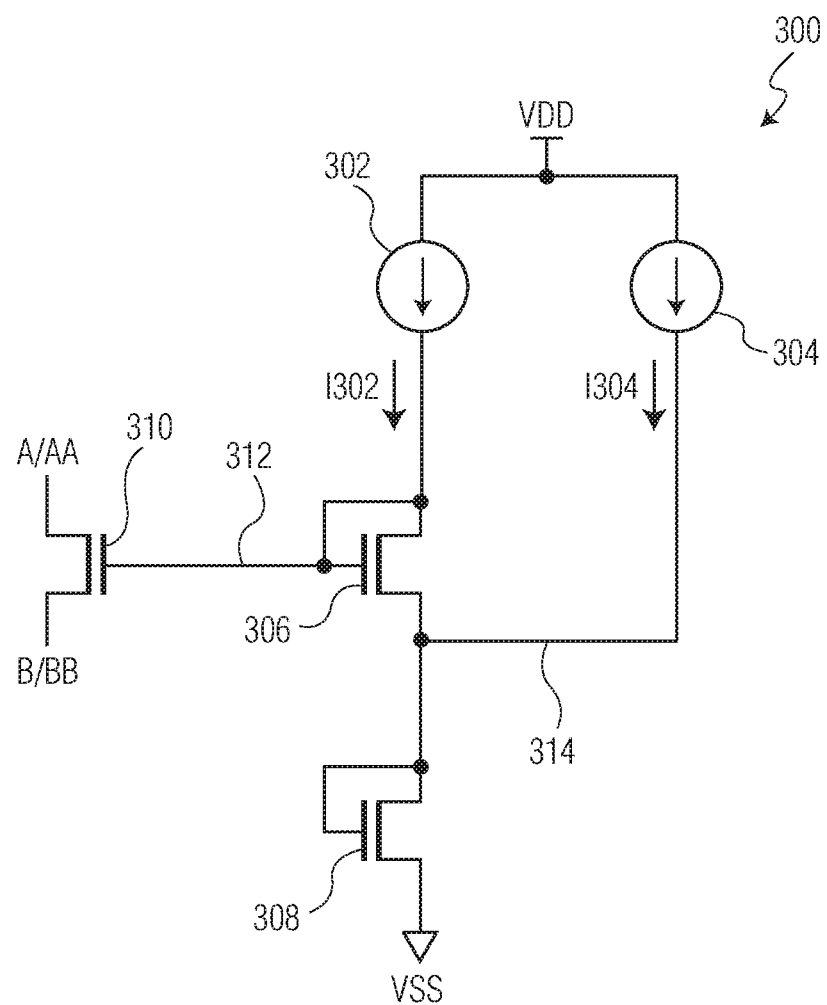
FIG. 3 illustrates, in simplified schematic diagram form, an example implementation of a current limiter circuit in accordance with an embodiment.

Current source 102 is configured and arranged to generate a current I1. The current I1 is generated as a bias current IB multiplied by a ratio multiplier M (e.g., I1=M×IB). Current source 102 includes a first terminal connected at the IN terminal and a second terminal connected to a voltage supply terminal labeled VDD. The rectifier circuit is connected at the IN terminal and includes a diode 122 and a capacitor 124. An anode terminal of diode 122 is connected at the IN terminal and a cathode terminal of diode 122 is connected to a first terminal of capacitor 124 at node labeled A. A second terminal of capacitor 124 is connected at a voltage supply terminal labeled VSS. An input terminal of current limiter 108 is connected at node A and an output terminal of current limiter 108 is connected at node labeled B. An example implementation of current limiter 108 is depicted in FIG. 3.

Current source 104 is configured and arranged to generate a current I2. The current I2 is generated as the bias current IB multiplied by a ratio multiplier L (e.g., I2=L×IB). A first terminal of current source 104 is connected at node B and a second terminal of current source 104 is connected at the VDD supply terminal. A current mirror 110 labeled CM1 is connected at the VSS supply terminal. A first current leg of current mirror 110 is connected at node B and a second current leg of current mirror 110 is connected at node labeled C. Example implementations of current mirrors 110-114 are depicted in FIGS. 4-7.

Current source 106 is configured and arranged to generate a current I3. The current I3 is generated as the bias current IB multiplied by a ratio multiplier N (e.g., I3=N×IB). Current source 106 includes a first terminal connected at node C and a second terminal connected at the VDD supply terminal. A second current mirror 112 labeled CM2 is connected at the VDD supply terminal. A first current leg of current mirror 112 is connected at node C. A third current mirror 114 labeled CM3 is connected at the VSS supply terminal. A second current leg of current mirror 112 is connected to a first current leg of current mirror 114 at node labeled D. A second current leg of current mirror 114 is connected at node labeled E. Current source 116 is configured and arranged to generate a current I9. The current I9 is generated as the bias current IB multiplied by a ratio multiplier P, where multiplier P is a sum of multipliers M+L−N+1 (e.g., I9=(M+L−N+1)×IB). A first terminal of a fourth current source 116 is connected at node E and a second terminal of current source 116 is connected at the VDD supply terminal. An output error current IE1 at a current branch labeled IE1 connected at node E is provided by current I9 minus current I8.

The amplifier circuit block 118 includes an input terminal connected at node E to receive an input current labeled IE1 and an output terminal connected at the OUT terminal to provide an output current labeled IOUT1. The amplifier circuit 118 serves as a gain stage and is configured to generate the IOUT1 current as an amplified or multiplied received input current IE1. In this embodiment, the amplifier circuit 118 may be implemented with any suitable circuitry (e.g., current mirror) for amplifying or multiplying the IE1 current received at the input terminal. In other embodiments, the amplifier circuit 118 may be implemented as a current to voltage converter providing an output voltage at the OUT terminal based on the IE1 current received.

The clamp circuit 120 includes a first terminal connected at the IN terminal and a second terminal connected at the VSS supply terminal. The clamp circuit 120 serves to protect circuitry coupled at the IN terminal. For example, during an EMI event, the input current IIN may be several orders of magnitude higher than during nominal operating conditions increasing or decreasing the input voltage to damaging levels. The clamp circuit 120 protects the circuitry coupled at the IN terminal by limiting the input voltage to predetermined voltage levels thus preventing damage. In an embodiment, clamp circuit 120 may be implemented with a Zener diode having an anode terminal connected to the VSS supply terminal and a cathode terminal connected to the IN terminal. In other embodiments, clamp circuit 120 may be implemented with other circuitry configured to clamp the voltage at the IN terminal.

In the embodiment depicted in FIG. 1, current sense circuit 100 is configured and arranged to generate an output error current IE1, for example, which is bound so that a minimum and maximum sensed current is known and predetermined by design. Having a bounded current allows for a known output current even during EMI disturbance conditions such as RF interference, and thus, prevents subsequent stages from becoming unbiased due to lack of current or excessive current. Further, the output current IE1, for example, can be kept constant under EMI conditions.

Current source 102 is configured and arranged to generate current I1 which serves to allow detection of a negative IIN current. A minimum or lower bound sensed current (e.g., during disturbance conditions) occurs when current IIN is a negative current larger in magnitude than current I1 (e.g., IIN<=−I1). Diode 122 prevents negative current from propagating into current limiter 108. A positive current ID through diode 122, provided by input current IIN plus current I1 (e.g., ID=IIN+I1), flows through current limiter 108 until a predetermined current limit value (ICLV) is reached. Current limiter 108 is configured and arranged to limit current to not exceed the ICLV and serves to provide a maximum or upper bound sensed current. A current I4 in the first current leg of current mirror 110 coupled at node B is provided by current ID plus current I2 (e.g., I4=ID+I2) when ID is equal to or less than the ICLV. When the current ID is essentially zero (e.g., negative IIN current), the minimum or lower bound sensed current is current I4 provided by current I2 (e.g., I4=I2). In turn, a mirrored current I5 is generated in the second current leg of current mirror 110 (e.g., I5=ID+I2, ID<=ICLV). A current I6 in the first current leg of current mirror 112 coupled at node C is provided by current I5 minus current I3 (e.g., I6=I5−I3). In turn, a mirrored current I7 is generated in the second current leg of current mirror 112 (e.g., I7=I5−I3). Current mirror 114 is connected to current mirror 112 at node D such that the current I7 flows in the first current leg of current mirror 114. In turn, a mirrored current I8 is generated in the second current leg of current mirror 114 (e.g., I8=I5−I3). Output current IE1 is provided by current I9 minus current I8 (e.g., IE1=I9−I8). Parameters such as ratio multipliers M, N, L, bias current IB, and ICLV serve to define a transfer function from input current IIN to the output error current IE1.

Figure 2:
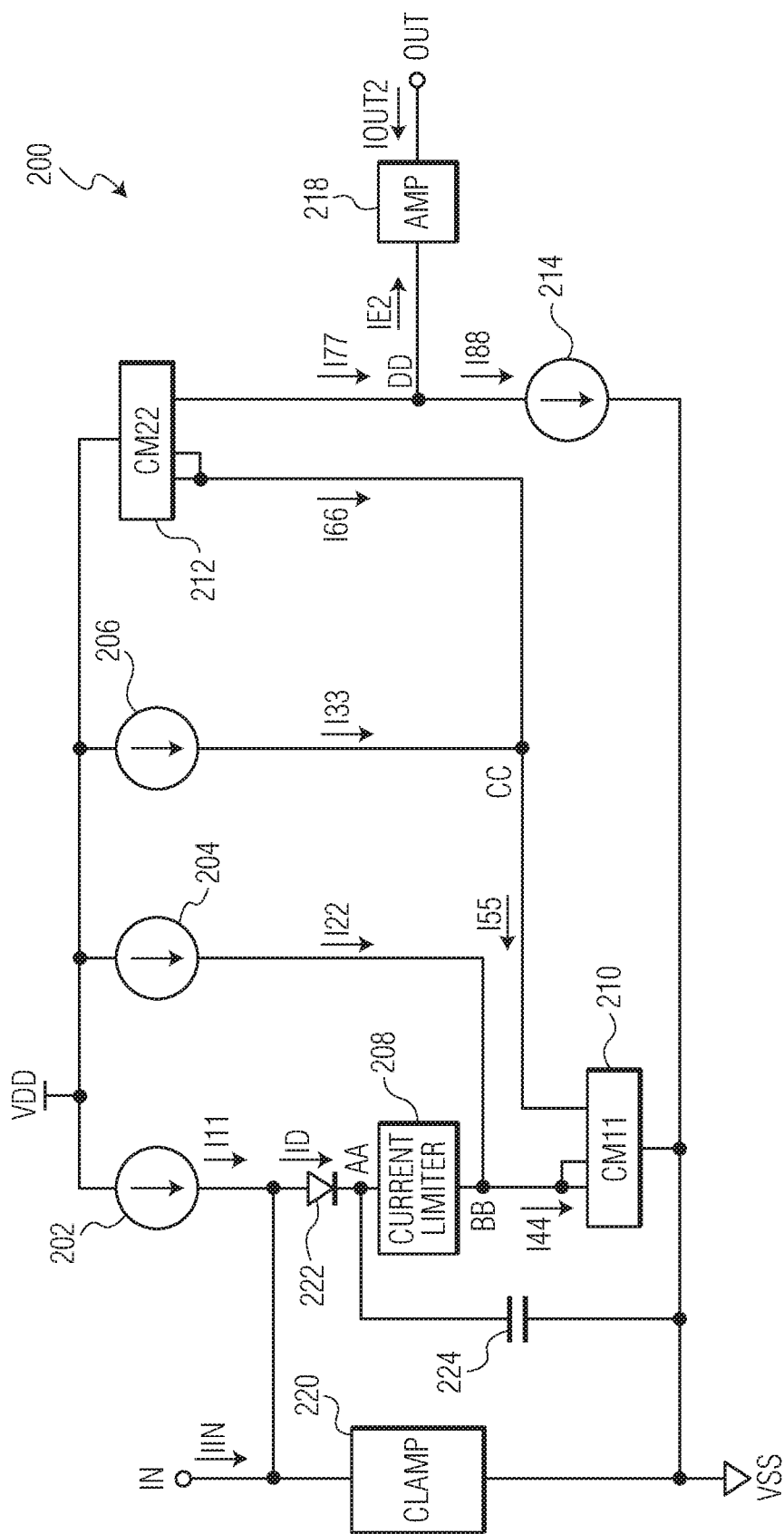
FIG. 2 illustrates, in simplified schematic diagram form, an alternative example current sense circuit in accordance with an embodiment.

FIG. 2 illustrates, in simplified schematic diagram form, an example current sense circuit 200 in accordance with an embodiment. Current sense circuit 200 is formed as an integrated circuit and includes a current limiter circuit block 208, a current rectifier circuit 222 and 224, a clamp circuit block 220, an amplifier circuit block 218, current sources 202-206 and 214, and current mirrors 210 and 212. An input terminal labeled IN is coupled to sense an input current IIN and an output terminal labeled OUT is coupled for generating and providing an amplified current IOUT2 based on the sensed current IIN.

Current source 202 is configured and arranged to generate a current I11. The current I11 is generated as a bias current IB multiplied by a ratio multiplier M (e.g., I11=M×IB). Current source 202 includes a first terminal connected at the IN terminal and a second terminal connected to a voltage supply terminal labeled VDD. The rectifier circuit is connected at the IN terminal and includes a diode 222 and a capacitor 224. An anode terminal of diode 222 is connected at the IN terminal and a cathode terminal of diode 222 is connected to a first terminal of capacitor 224 at node labeled AA. A second terminal of capacitor 224 is connected at a voltage supply terminal labeled VSS. An input terminal of current limiter 208 is connected at node AA and an output terminal of current limiter 208 is connected at node labeled BB. An example implementation of current limiter 208 is depicted in FIG. 3.

Current source 204 is configured and arranged to generate a current I22. The current I22 is generated as the bias current IB multiplied by a ratio multiplier L (e.g., I22=L×IB). A first terminal of current source 204 is connected at node BB and a second terminal of current source 204 is connected at the VDD supply terminal. A current mirror 210 labeled CM11 is connected at the VSS supply terminal. A first current leg of current mirror 210 is connected at node BB and a second current leg of current mirror 210 is connected at node labeled CC. Example implementations of current mirrors 210 and 212 are depicted in FIGS. 4-7.

Current source 206 is configured and arranged to generate a current I33. The current I33 is generated as the bias current IB multiplied by a ratio multiplier N (e.g., I33=N×IB). Current source 206 includes a first terminal connected at node CC and a second terminal connected at the VDD supply terminal. A second current mirror 212 labeled CM22 is connected at the VDD supply terminal. A first current leg of current mirror 212 is connected at node CC. A second current leg of current mirror 212 is connected at node labeled DD. Current source 214 is configured and arranged to source a current I88. The current I88 is generated as the bias current IB multiplied by a ratio multiplier Q, where multiplier Q is a first sum of multipliers M+L−N−1 (e.g., I88=(M+L−N−1)×IB) or a second sum of multipliers M+L−N+1 (e.g., I88=(M+L−N+1)×IB). A first terminal of a fourth current source 214 is connected at node DD and a second terminal of current source 214 is connected at the VSS supply terminal. An output error current IE2 at a current branch labeled IE2 connected at node DD is provided by current I77 minus current I88.

The amplifier circuit block 218 includes an input terminal connected at node DD to receive an input current labeled IE2 and an output terminal connected at the OUT terminal to provide an output current labeled IOUT2. The amplifier circuit 218 serves as a gain stage and is configured to generate the IOUT2 current as an amplified or multiplied received input current IE2. In this embodiment, the amplifier circuit 218 may be implemented with any suitable circuitry (e.g., current mirror) for amplifying or multiplying the 1E2 current received at the input terminal. In other embodiments, the amplifier circuit 218 may be implemented as a current to voltage converter providing an output voltage at the OUT terminal based on the IE2 current received.

The clamp circuit 220 includes a first terminal connected at the IN terminal and a second terminal connected at the VSS supply terminal. The clamp circuit 220 serves to protect circuitry coupled at the IN terminal. For example, during an EMI event, the input current IIN may be several orders of magnitude higher than during nominal operating conditions increasing or decreasing the input voltage to damaging levels. The clamp circuit 220 protects the circuitry coupled at the IN terminal by limiting the input voltage to predetermined voltage levels thus preventing damage. In an embodiment, clamp circuit 220 may be implemented with a Zener diode having an anode terminal connected to the VSS supply terminal and a cathode terminal connected to the IN terminal. In other embodiments, clamp circuit 220 may be implemented with other circuitry configured to clamp the voltage at the IN terminal.

In the embodiment depicted in FIG. 2, current sense circuit 200 is configured and arranged to generate an output current IE2, for example, which is bound so that a minimum and maximum sensed current is known and predetermined by design. Having a bounded current allows for a known output current even during EMI disturbance conditions such as RF interference, and thus, prevents subsequent stages from becoming unbiased due to lack of current or excessive current. Further, the output current IE2, for example, can be kept constant under EMI conditions.

Current source 202 is configured and arranged to generate current I11 which serves to allow detection of a negative IIN current. A minimum or lower bound sensed current (e.g., during disturbance conditions) occurs when current IIN is a negative current larger in magnitude than current I11 (e.g., IIN<=−I11). Diode 222 prevents negative current from propagating into current limiter 208. A current ID through diode 222, provided by input current IIN plus current I11 (e.g., ID=IIN+I11), flows through current limiter 208 until a predetermined current limit value (ICLV) is reached. Current limiter 208 is configured and arranged to limit current to not exceed the ICLV and serves to provide a maximum or upper bound sensed current. A current I44 in the first current leg of current mirror 210 coupled at node BB is provided by current ID plus current I22 (e.g., I44=ID+I22) when ID is equal to or less than the ICLV. When the current ID is essentially zero (e.g., negative IIN current), the minimum or lower bound sensed current is current I4 provided by current I2 (e.g., I4=I2). In turn, a mirrored current I55 is generated in the second current leg of current mirror 210 (e.g., I55=ID+I22, ID<=ICLV). A current I66 in the first current leg of current mirror 212 coupled at node CC is provided by current I55 minus current I33 (e.g., I66=I55−I33). In turn, a mirrored current I77 is generated in the second current leg of current mirror 212 (e.g., I77=I55−I33). Output current IE2 is provided by current I77 minus current I88 (e.g., IE2=I77−I88). Parameters such as ratio multipliers M, N, L, bias current IB, and ICLV serve to define a transfer function from input current IIN to the output error current IE2.

FIG. 3 illustrates, in simplified schematic diagram form, an example implementation of a current limiter circuit 300 in accordance with an embodiment. Current limiter 300 is an example implementation of the current limiter circuit blocks 108 and 208 depicted in FIGS. 1 and 2, respectively. In this embodiment, current limiter 300 includes current sources 302 and 304 and N-channel transistors 306-310. In other embodiments, current limiter 300 may be implemented by way of alternative circuitry. Current limiter 300 includes a first terminal labeled A/AA corresponding to the A and AA terminals of FIGS. 1 and 2 and a second terminal labeled B/BB corresponding to the B and BB terminals of FIGS. 1 and 2.

Current source 302 is configured and arranged to generate a current I302 (e.g., I302=ICLV). Current source 302 includes a first terminal connected at node 312 and a second terminal connected to the VDD supply terminal. Current source 304 is configured and arranged to generate a current I304 (e.g., I304=L×IB). Current source 304 includes a first terminal connected at node 314 and a second terminal connected to the VDD supply terminal.

A first current electrode of transistor 306 is connected to control electrodes of transistors 306 and 310 at node 312. A first current electrode of transistor 310 is connected at the A/AA terminal and a second current electrode of transistor 310 is connected at the B/BB terminal. A second current electrode of transistor 306 is connected to a first current electrode and a control electrode of transistor 308 at node 314. A second current electrode of transistor 308 is connected to the VSS supply terminal. In this arrangement, transistor 308 is configured as a diode.

In the embodiment depicted in FIG. 3, current sources 302 and 304 and transistors 306 and 308 are configured and arranged to generate a bias voltage at node 312. Transistor 310 serves to control the amount of current flowing between terminals A/AA and B/BB based on the bias voltage applied to the control electrode of transistor 310 connected at node 312. The bias voltage generated at node 312 is a predetermined value chosen such that a desired current limit value is realized.

Figure 4:
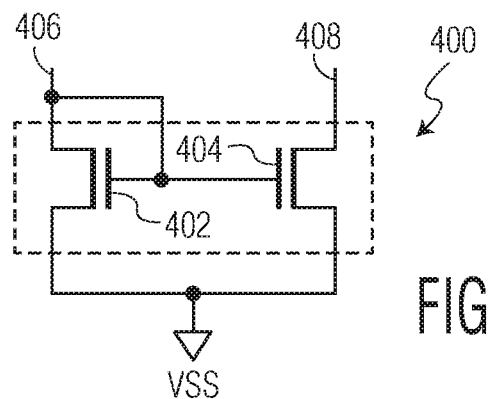
FIGS. 4-7 illustrate, in simplified schematic diagram form, example current mirror implementations in accordance with an embodiment.
Figure 5:
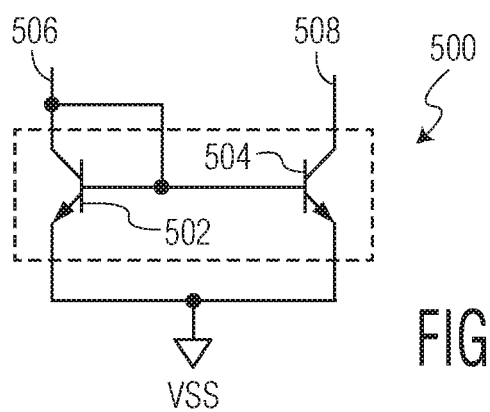
Figure 6:
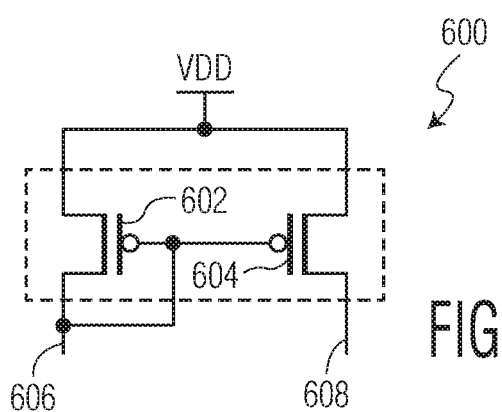
Figure 7:
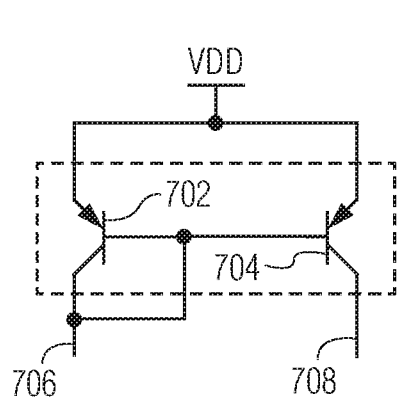

FIGS. 4-7 illustrate, in simplified schematic diagram form, example current mirror implementations for current mirrors 110-114 and 210 and 212 depicted in FIGS. 1 and 2, respectively, in accordance with an embodiment. More specifically, the circuits illustrated in FIGS. 4 and 5 are example implementations for current mirrors 110, 114, and 210 depicted in FIGS. 1 and 2 and the circuits illustrated in FIGS. 6 and 7 are example implementations for current mirrors 112 and 212 depicted in FIGS. 1 and 2. In other embodiments, current mirrors 110-114 and 210 and 212 may be implemented by way of alternative circuitry.

FIG. 4 depicts example current mirror 400 implemented with N-channel transistors 402 and 404. A first current leg includes transistor 402 having a current path between node 406 and the VSS supply terminal, and a second current leg includes transistor 404 having a current path between node 408 and the VSS supply terminal. Current mirror 400 is configured and arranged to generate a mirrored current in the second current leg based on a current in the first current leg. A first current electrode of transistor 402 is connected to control electrodes of transistors 402 and 404 at node 406. A first current electrode of transistor 404 is connected at node 408 and second current electrodes of transistors 402 and 404 are connected at the VSS supply terminal. In this implementation, transistor sizes may be chosen to establish a desired current relationship (e.g., 1:1, 1:2, 2:1, etc.) between current in the first current leg and mirrored current in the second current leg.

FIG. 5 depicts example current mirror 500 implemented with NPN bipolar transistors 502 and 504. A first current leg includes transistor 502 having a current path between node 506 and the VSS supply terminal, and a second current leg includes transistor 504 having a current path between node 508 and the VSS supply terminal. Current mirror 500 is configured and arranged to generate a mirrored current in the second current leg based on a current in the first current leg. A first current electrode of transistor 502 is connected to control electrodes of transistors 502 and 504 at node 506. A first current electrode of transistor 504 is connected at node 508 and second current electrodes of transistors 502 and 504 are connected at the VSS supply terminal. In this implementation, transistor sizes may be chosen to establish a desired current relationship (e.g., 1:1, 1:2, 2:1, etc.) between current in the first current leg and mirrored current in the second current leg.

FIG. 6 depicts example current mirror 600 implemented with P-channel transistors 602 and 604. A first current leg includes transistor 602 having a current path between node 606 and the VDD supply terminal, and a second current leg includes transistor 604 having a current path between node 608 and the VDD supply terminal. Current mirror 600 is configured and arranged to generate a mirrored current in the second current leg based on a current in the first current leg. A first current electrode of transistor 602 is connected to control electrodes of transistors 602 and 604 at node 606. A first current electrode of transistor 604 is connected at node 608 and second current electrodes of transistors 602 and 604 are connected at the VDD supply terminal. In this implementation, transistor sizes may be chosen to establish a desired current relationship (e.g., 1:1, 1:2, 2:1, etc.) between current in the first current leg and mirrored current in the second current leg.

FIG. 7 depicts example current mirror 700 implemented with PNP bipolar transistors 702 and 704. A first current leg includes transistor 702 having a current path between node 706 and the VDD supply terminal, and a second current leg includes transistor 704 having a current path between node 708 and the VDD supply terminal. Current mirror 700 is configured and arranged to generate a mirrored current in the second current leg based on a current in the first current leg. A first current electrode of transistor 702 is connected to control electrodes of transistors 702 and 704 at node 706. A first current electrode of transistor 704 is connected at node 708 and second current electrodes of transistors 702 and 704 are connected at the VDD supply terminal. In this implementation, transistor sizes may be chosen to establish a desired current relationship (e.g., 1:1, 1:2, 2:1, etc.) between current in the first current leg and mirrored current in the second current leg.

Generally, there is provided, a current sense circuit including an input terminal coupled to sense an input current; a diode having a first terminal and a second terminal, the first terminal coupled at the input terminal; a current limiter having a first terminal and a second terminal, the first terminal coupled to the second terminal of the diode at a first node; a first current source having a first terminal and a second terminal and configured to generate a first current, the first terminal coupled to the second terminal of the current limiter at a second node; and a first current mirror coupled to a first voltage supply terminal and having a first leg and a second leg, the first leg coupled at the second node and the second leg coupled for generating a first output current. The current sense circuit may further include a second current source having a first terminal and a second terminal and configured to generate a second current, the first terminal coupled to the second leg of the first current mirror at a third node. The current sense circuit may further include a capacitor having a first terminal and a second terminal, the first terminal coupled at the first node and the second terminal coupled at the first voltage supply terminal. The current sense circuit may further include a clamp circuit having a first terminal and a second terminal, the first terminal coupled at the input terminal and the second terminal coupled at the first voltage supply terminal. The current limiter may include a first transistor having a first current electrode coupled at the first node and a second current electrode coupled at the second node; a second transistor having a first current electrode coupled to control electrodes of the first transistor and the second transistor; and a third transistor configured as a second diode having a first current electrode and a control electrode coupled to a second current electrode of the second transistor. The current sense circuit may further include a second current mirror coupled to a second voltage supply terminal and having a first leg and a second leg, the first leg coupled to the second leg of the first current mirror and the second leg coupled for generating a mirrored current of the first output current. The current sense circuit may further include an amplifier circuit having an input coupled to the second leg of the second current mirror and an output coupled for generating an amplified current based on the first output current. The current sense circuit may further include a third current mirror coupled to the first voltage supply terminal and having a first leg and a second leg, the first leg coupled to the second leg of the second current mirror and the second leg coupled for generating a second output current based on a mirrored current of the first leg. The current sense circuit may further include a third current source having a first terminal and a second terminal, the first terminal coupled at the input terminal and configured to generate a third current.

In another embodiment, there is provided, a current sense circuit including a diode having an anode terminal coupled to an input terminal and a cathode terminal, the input terminal coupled for sensing an input current; a current limiter having a first terminal and a second terminal, the first terminal coupled to the cathode terminal of the diode at a first node; a first current mirror coupled to a first voltage supply terminal and having a first leg and a second leg, the first leg coupled to the second terminal of the current limiter at a second node; a first current source including a first terminal and a second terminal and configured to generate a first current, the first terminal coupled at the second node; a second current source including a first terminal and a second terminal and configured to generate a second current, the first terminal coupled to the second leg of the first current mirror at a third node; and a first current branch coupled at the third node, the first current branch coupled for generating a first output current. The current sense circuit may further include a second current mirror coupled to a second voltage supply terminal and having a first leg and a second leg, the first leg coupled to the third node by way of the first current branch and the second leg coupled for generating a second output current, the second output current a mirrored current of the first output current. The current limiter may include a first transistor having a first current electrode coupled at the first node and a second current electrode coupled at the second node; a second transistor having a first current electrode coupled to control electrodes of the first transistor and the second transistor; and a third current source including a first terminal coupled to the first current electrode of the second transistor, the third current source configured to generate a third current. The current sense circuit may further include a capacitor having a first terminal and a second terminal, the first terminal coupled at the first node and the second terminal coupled at the first voltage supply terminal. The current sense circuit may further include a clamp circuit having a first terminal and a second terminal, the first terminal coupled at the input terminal and the second terminal coupled at the first voltage supply terminal. The clamp circuit may include a Zener diode coupled to the first voltage supply terminal. The current sense circuit may further include a third current source including a first terminal coupled at the input terminal, the third current source configured to generate a third current. The first output current may be bound at a lower limit based on the third current.

In yet another embodiment, there is provided, a current sense circuit including a current rectifier circuit having a first terminal coupled to an input terminal, the input terminal coupled for sensing an input current; a current limiter having a first terminal and a second terminal, the first terminal coupled to a second terminal of the current rectifier circuit at a first node; a first current mirror coupled to a first voltage supply terminal and having a first leg and a second leg, the first leg coupled to the second terminal of the current limiter at a second node; a first current source having a first terminal and a second terminal and configured to generate a first current, the first terminal coupled at the second node; a second current source having a first terminal and a second terminal and configured to generate a second current, the first terminal coupled to the second leg of the first current mirror at a third node; and a first current branch coupled at the third node, the first current branch coupled for generating a first output current. The current sense circuit may further include a diode having an anode terminal coupled to the input terminal and a cathode terminal coupled at the first node; and a capacitor having a first terminal coupled at the first node and a second terminal coupled at the first voltage supply terminal. The first current mirror and the second current source may be configured and arranged such that the first output current is a current in the second leg of the first current mirror minus the second current.

By now it should be appreciated that there has been provided, a current sense circuit configured and arranged to bound a sensed current with predetermined minimum and maximum currents, and thus improving robustness. By bounding the sensed current, subsequent stages are prevented from becoming unbiased due to lack of current or excessive current. Having a bounded sensed current allows for a known output current during disturbance conditions such as electro-magnetic interference (EMI). Because the current sensing is based on current mirrors ratios, the current sense circuit is process, voltage, and temperature independent.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A current sense circuit comprising:
   an input terminal coupled to sense an input current;
   a diode having a first terminal and a second terminal, the first terminal coupled at the input terminal;
   a current limiter having a first terminal and a second terminal, the first terminal coupled to the second terminal of the diode at a first node;
   a first current source having a first terminal and a second terminal and configured to generate a first current, the first terminal coupled to the second terminal of the current limiter at a second node; and
   a first current mirror coupled to a first voltage supply terminal and having a first leg and a second leg, the first leg coupled at the second node and the second leg coupled for generating a first output current.

2. The current sense circuit of claim 1, further comprising:
   a second current source having a first terminal and a second terminal and configured to generate a second current, the first terminal coupled to the second leg of the first current mirror at a third node.

3. The current sense circuit of claim 1, further comprising:
   a capacitor having a first terminal and a second terminal, the first terminal coupled at the first node and the second terminal coupled at the first voltage supply terminal.

4. The current sense circuit of claim 1, further comprising:
   a clamp circuit having a first terminal and a second terminal, the first terminal coupled at the input terminal and the second terminal coupled at the first voltage supply terminal.

5. The current sense circuit of claim 1, wherein the current limiter comprises:
   a first transistor having a first current electrode coupled at the first node and a second current electrode coupled at the second node;
   a second transistor having a first current electrode coupled to control electrodes of the first transistor and the second transistor; and
   a third transistor configured as a second diode having a first current electrode and a control electrode coupled to a second current electrode of the second transistor.

6. The current sense circuit of claim 1, further comprising:
   a second current mirror coupled to a second voltage supply terminal and having a first leg and a second leg, the first leg coupled to the second leg of the first current mirror and the second leg coupled for generating a mirrored current of the first output current.

7. The current sense circuit of claim 6, further comprising:
   an amplifier circuit having an input coupled to the second leg of the second current mirror and an output coupled for generating an amplified current based on the first output current.

8. The current sense circuit of claim 6, further comprising:
   a third current mirror coupled to the first voltage supply terminal and having a first leg and a second leg, the first leg coupled to the second leg of the second current mirror and the second leg coupled for generating a second output current based on a mirrored current of the first leg.

9. The current sense circuit of claim 1, further comprising:
a third current source having a first terminal and a second terminal, the first terminal coupled at the input terminal and configured to generate a third current.

10. A current sense circuit comprising:
a diode having an anode terminal coupled to an input terminal and a cathode terminal, the input terminal coupled for sensing an input current;
a current limiter having a first terminal and a second terminal, the first terminal coupled to the cathode terminal of the diode at a first node;
a first current mirror coupled to a first voltage supply terminal and having a first leg and a second leg, the first leg coupled to the second terminal of the current limiter at a second node;
a first current source including a first terminal and a second terminal and configured to generate a first current, the first terminal coupled at the second node;
a second current source including a first terminal and a second terminal and configured to generate a second current, the first terminal coupled to the second leg of the first current mirror at a third node; and
a first current branch coupled at the third node, the first current branch coupled for generating a first output current.

11. The current sense circuit of claim 10, further comprising:
a second current mirror coupled to a second voltage supply terminal and having a first leg and a second leg, the first leg coupled to the third node by way of the first current branch and the second leg coupled for generating a second output current, the second output current a mirrored current of the first output current.

12. The current sense circuit of claim 10, wherein the current limiter comprises:
a first transistor having a first current electrode coupled at the first node and a second current electrode coupled at the second node;
a second transistor having a first current electrode coupled to control electrodes of the first transistor and the second transistor; and
a third current source including a first terminal coupled to the first current electrode of the second transistor, the third current source configured to generate a third current.

13. The current sense circuit of claim 10, further comprising:
a capacitor having a first terminal and a second terminal, the first terminal coupled at the first node and the second terminal coupled at the first voltage supply terminal.

14. The current sense circuit of claim 10, further comprising:
a clamp circuit having a first terminal and a second terminal, the first terminal coupled at the input terminal and the second terminal coupled at the first voltage supply terminal.

15. The current sense circuit of claim 14, wherein the clamp circuit comprises a Zener diode coupled to the first voltage supply terminal.

16. The current sense circuit of claim 10, further comprising:
a third current source including a first terminal coupled at the input terminal, the third current source configured to generate a third current.

17. The current sense circuit of claim 16, wherein the first output current is bound at a lower limit based on the third current.

18. A current sense circuit comprising:
a current rectifier circuit having a first terminal coupled to an input terminal, the input terminal coupled for sensing an input current;
a current limiter having a first terminal and a second terminal, the first terminal coupled to a second terminal of the current rectifier circuit at a first node;
a first current mirror coupled to a first voltage supply terminal and having a first leg and a second leg, the first leg coupled to the second terminal of the current limiter at a second node;
a first current source having a first terminal and a second terminal and configured to generate a first current, the first terminal coupled at the second node;
a second current source having a first terminal and a second terminal and configured to generate a second current, the first terminal coupled to the second leg of the first current mirror at a third node; and
a first current branch coupled at the third node, the first current branch coupled for generating a first output current.

19. The current sense circuit of claim 18, further comprising:
a diode having an anode terminal coupled to the input terminal and a cathode terminal coupled at the first node; and
a capacitor having a first terminal coupled at the first node and a second terminal coupled at the first voltage supply terminal.

20. The current sense circuit of claim 18, wherein the first current mirror and the second current source are configured and arranged such that the first output current is a current in the second leg of the first current mirror minus the second current.

* * * * *